US006494998B1

(12) United States Patent
Brcka

(10) Patent No.: US 6,494,998 B1
(45) Date of Patent: *Dec. 17, 2002

(54) PROCESS APPARATUS AND METHOD FOR IMPROVING PLASMA DISTRIBUTION AND PERFORMANCE IN AN INDUCTIVELY COUPLED PLASMA USING AN INTERNAL INDUCTIVE ELEMENT

(75) Inventor: Jozef Brcka, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/650,532

(22) Filed: Aug. 30, 2000

(51) Int. Cl.[7] .......................... C23C 14/34; C23C 16/00; C23F 1/02; H01J 7/24

(52) U.S. Cl. .............................. 204/192.12; 204/298.06; 204/298.07; 118/723 I; 156/345; 315/111.21; 315/111.51

(58) Field of Search ........................ 204/298.06, 298.07, 204/192.12; 118/723 I; 156/345; 315/111.21, 111.51

(56) References Cited

U.S. PATENT DOCUMENTS

| | | | |
|---|---|---|---|
| 4,431,901 A | 2/1984 | Hull | 219/121 PR |
| 4,844,775 A | 7/1989 | Keeble | 156/643 |
| 4,941,915 A | 7/1990 | Matsuoka et al. | 204/298 |
| 4,948,458 A | 8/1990 | Ogle | 156/643 |
| 5,122,251 A | 6/1992 | Campbell et al. | 204/298.06 |
| 5,178,739 A | 1/1993 | Barnes et al. | 204/192.12 |
| 5,226,967 A | 7/1993 | Chen et al. | 118/723 |
| 5,231,334 A | 7/1993 | Paranjpe | 315/111.21 |
| 5,234,529 A | 8/1993 | Johnson | 156/345 |
| 5,277,751 A | 1/1994 | Ogle | 156/643 |
| 5,280,154 A | 1/1994 | Cuomo et al. | 219/121.52 |
| 5,304,279 A | 4/1994 | Coultas et al. | 156/345 |
| 5,309,063 A | 5/1994 | Singh | 315/111.51 |

(List continued on next page.)

FOREIGN PATENT DOCUMENTS

| | | |
|---|---|---|
| EP | 0 553 704 A1 | 8/1993 |
| EP | 0 593 924 A1 | 9/1993 |
| EP | 0 756 309 A1 | 1/1997 |
| EP | 0 782 172 A2 | 7/1997 |
| EP | 0 813 277 A2 | 12/1997 |
| EP | 0 820 086 A1 | 1/1998 |

(List continued on next page.)

OTHER PUBLICATIONS

Fukasawa, Takayuki et al., *RF Self–Bias Characteristics in Inductively Coupled Plasma*, Jpn. J. Appl. Phys. vol. 32 (1993) pp. 6076–6079.

J. Hopwood nd F. Qian, *Mechanisms for Highly Ionized Magnetron Sputtering*, J. Appl. Phys., vol. 78, No. 2, (1995), pp. 758–765.

(List continued on next page.)

*Primary Examiner*—Patrick Ryan
*Assistant Examiner*—Gregg Cantelmo
(74) *Attorney, Agent, or Firm*—Wood, Herron & Evans, LLP

(57) ABSTRACT

A processing system 12 for processing a substrate with an ionized plasma comprises a processing chamber 13 defining a processing space 14 and including a substrate support 17, a gas inlet 20, and a plasma source for creating an ionized plasma in the processing space. The plasma source comprises an inductive element 24 operable for coupling electrical energy into the processing space. The inductive element 24 winds around portions of the processing space 14 inside the processing chamber 13 and is encased inside a dielectric material 30 to physically separate the element from the processing space while allowing the element to couple electrical energy into the processing space. Alternatively, the inductive element is coupled to a DC power supply 98 for enhancing its magnetization to reduce the capacitive coupling of energy between the inductive element and the plasma.

19 Claims, 7 Drawing Sheets

U.S. PATENT DOCUMENTS

| | | | |
|---|---|---|---|
| 5,368,710 A | 11/1994 | Chen et al. | 204/192.32 |
| 5,401,350 A | 3/1995 | Patrick et al. | 156/345 |
| 5,421,891 A | 6/1995 | Campbell et al. | 118/723 R |
| 5,430,355 A | 7/1995 | Paranjpe | 315/111.21 |
| 5,436,528 A | 7/1995 | Paranjpe | 315/111.51 |
| 5,464,476 A | 11/1995 | Gibb et al. | 118/723 MP |
| 5,556,521 A | 9/1996 | Ghanbari | 204/192.32 |
| 5,558,722 A | 9/1996 | Okumura et al. | 118/723 I |
| 5,560,776 A | 10/1996 | Sugai et al. | 118/723 AN |
| 5,565,738 A | 10/1996 | Samukawa et al. | 315/111.51 |
| 5,580,385 A | 12/1996 | Paranjpe et al. | 118/723 I |
| 5,587,038 A | 12/1996 | Cecchi et al. | 156/345 |
| 5,587,226 A | 12/1996 | Leung et al. | 428/210 |
| 5,589,737 A | 12/1996 | Barnes et al. | 315/111.21 |
| 5,591,493 A | 1/1997 | Paranjpe et al. | 427/569 |
| 5,619,103 A | 4/1997 | Tobin et al. | 315/111.21 |
| 5,648,701 A | 7/1997 | Hooke et al. | 315/111.21 |
| 5,650,032 A | 7/1997 | Keller et al. | 156/345 |
| 5,669,975 A | 9/1997 | Ashtiani | 118/723 I |
| 5,683,537 A | 11/1997 | Ishii | 156/345 |
| 5,685,941 A | 11/1997 | Forster et al. | 156/345 |
| 5,688,357 A | 11/1997 | Hanawa | 156/345 |
| 5,710,486 A | 1/1998 | Ye et al. | 315/111.21 |
| 5,711,850 A | 1/1998 | Okumura et al. | 156/643.1 |
| 5,716,451 A | 2/1998 | Hama et al. | 118/723 |
| 5,753,044 A | 5/1998 | Hanawa et al. | 118/723 I |
| 5,759,280 A | 6/1998 | Holland et al. | 118/723 I |
| 5,763,851 A | 6/1998 | Forster et al. | 219/121.43 |
| 5,772,832 A | 6/1998 | Collins et al. | 156/345 |
| 5,783,492 A | 7/1998 | Higuchi et al. | 438/710 |
| 5,785,878 A | 7/1998 | Lingampalli | 216/68 |
| 5,800,619 A | 9/1998 | Holland et al. | 118/723 I |
| 5,800,688 A | 9/1998 | Lantsman et al. | 204/298.11 |
| 5,824,158 A | 10/1998 | Takeuchi et al. | 118/723 IR |
| 5,824,607 A | 10/1998 | Trow et al. | 438/732 |
| 5,874,704 A | 2/1999 | Gates | 219/121.43 |
| 5,888,413 A | 3/1999 | Okumura et al. | 216/68 |
| 5,891,349 A | 4/1999 | Tobe et al. | 216/68 |
| 5,897,712 A | 4/1999 | Hanawa et al. | 216/68 |
| 5,897,713 A | 4/1999 | Tomioka et al. | 118/723 I |
| 5,907,221 A | 5/1999 | Sato et al. | 215/111.51 |
| 5,919,382 A | 7/1999 | Qian et al. | 219/121.52 |
| 5,948,215 A | 9/1999 | Lantsman | 204/192.12 |
| 5,976,334 A | 11/1999 | Fu et al. | 204/298.19 |
| 6,149,760 A | 11/2000 | Hama | 156/345 |
| 6,237,526 B1 * | 5/2001 | Brcka | 118/723 I |
| 6,245,202 B1 | 6/2001 | Edamura et al. | 204/298.06 |

FOREIGN PATENT DOCUMENTS

| | | | |
|---|---|---|---|
| EP | 0 336 218 A2 | 4/1998 | |
| EP | 0 838 843 A2 | 4/1998 | |
| EP | 0 840 350 A2 | 5/1998 | |
| EP | 10315411 | 9/1999 | |
| JP | 61 119 0070 A * | 8/1986 | 204/298.16 |
| WO | WO97/39607 | 10/1997 | |
| WO | WO00/17906 | 3/2000 | |
| WO | WO 00/36632 | 6/2000 | |

OTHER PUBLICATIONS

Dickson, M. et al., *Quenching of Electron Temperature and Electron Density in Ionized Physical Vapor Deposition*, J. Vac. Sci. Technol. A 15(2) 1997, pp. 340–344.

Khatar, Marwan H. et al., *Etch Uniformity Optimization in Low Pressure Inductively Coupled Plasmas: Source Design and Gas Distribution Effects (Abstract)*, Am. Vac. Socity, Northern California Chapter, Plasma Etch Users Group, 4th Int'l Workshop on Advanced Plasma Tools and Process Engineering, May 26–27, 1998, p. 97.

* cited by examiner

PROCESS APPARATUS AND METHOD FOR IMPROVING PLASMA DISTRIBUTION AND PERFORMANCE IN AN INDUCTIVELY COUPLED PLASMA USING AN INTERNAL INDUCTIVE ELEMENT

FIELD OF THE INVENTION

This invention relates generally to semiconductor processing utilizing a plasma, and specifically relates to the improvement of plasma distribution and process performance within a plasma generated and sustained through inductive coupling.

BACKGROUND OF THE INVENTION

Gas plasma generation is widely used in a variety of integrated circuit (IC) fabrication processes, including plasma etching, plasma enhanced chemical vapor deposition (PECVD), and plasma sputter deposition applications. Generally, plasmas are produced within a process chamber by introducing a low-pressure process gas into the chamber and then directing electrical energy into the chamber for creating an electrical field therein. The electrical field creates an electron flow within the chamber which ionizes individual gas atoms and molecules by transferring kinetic energy through individual electron-gas molecule collisions. The electrons are accelerated within the electric field, producing efficient ionization. The ionized particles of the gas and free electrons collectively form what is referred to as a gas plasma or discharge. The plasma may exist at various ionization levels from $10^{-6}$ up to fully ionized plasma (based on the fraction of ionized particles with respect to the total number of particles).

The plasma particles will generally be positively charged, and are commonly utilized for etching a surface of a substrate within the chamber or depositing a layer of material onto such a substrate. Within an etching process, the substrate may be negatively biased such that the positive plasma particles are attracted to the substrate surface to bombard the surface and thus remove surface particles or etch the substrate. In a sputter deposition process, a target may be positioned within the chamber opposite the substrate. The target is then biased so that plasma particles bombard the target and dislodge, or "sputter," target particles therefrom. The sputtered target particles then deposit upon the substrate to form a material layer on an exposed surface thereof. In ionized sputter deposition, hereinafter referred to as iPVD, the sputtered particles are themselves ionized before they are deposited. In a plasma enhanced CVD process, the electrically neutral, active radicals form a deposited layer on exposed surfaces. Generally, there are various different ways of producing a plasma within a process chamber. For example, a pair of opposing electrodes might be oriented within the chamber to capacitatively couple energy to the plasma. A microwave resonant chamber utilizing ultra-high frequency microwave fields might also be utilized. Electron cyclotron resonance (ECR) devices, on the other hand, use controlled magnetic fields in conjunction with microwave energy to induce circular electron flow within a process gas to create and sustain a plasma. Inductive coupling processes are also popular, and are particularly desirable for their capability of producing high-density plasmas. Inductively coupled plasmas (ICPS) generally utilize an inductive element such as a shaped coil or antenna positioned with respect to the processing chamber to inductively couple energy into the processing chamber and thus create and sustain a plasma therein.

For example, in one particular design for an inductively coupled plasma (ICP) system, an inductive coil or antenna is positioned proximate the top portion of the chamber to create a plasma within the chamber. More specifically, the antenna is positioned on one side of a dielectric plate or window at the top of the processing chamber, and electromagnetic energy from the antenna is coupled through the dielectric window and into the plasma. One such design is illustrated in U.S. Pat. No. 5,556,521 which is commonly owned with the present application.

In an alternative ICP processing system, a helical or solenoidal-shaped coil is wound around the outside of a sidewall portion of the processing chamber to inductively couple energy to the plasma through the chamber sidewall, rather than through the top of the chamber. In such a system, a portion of the chamber sidewall is fabricated from a dielectric material through which the inductively coupled energy may pass. One suitable dielectric material for a window or chamber sidewall is quartz. Various ICP systems are known and utilized in the art, as evidenced by various issued patents directed to particular ICP details, such as plasma uniformity, RF matching, and the performance characteristics of the antennas or other inductive elements.

The geometry of an ICP system is a significant factor in determining both the plasma density and uniformity, and ultimately, the processing uniformity over the area of the substrate. For current processes, it is desirable to produce a uniform, high-density plasma, over a significantly large area so that large substrate sizes might be accommodated. For example, manufacturing of today's ultra large-scale integrated (ULSI) circuits requires a dense, uniform plasma over large substrates having diameters of approximately 200 mm or greater.

More specifically, in an ICP system, the plasma is excited by heating or exciting electrons in the plasma region of the processing chamber. The inductive currents which heat the plasma electrons are derived from oscillating magnetic fields which are produced proximate the inside of the dielectric window or sidewall by RF currents within the inductive antenna or coil. The spatial distribution of those magnetic fields is a function of the sum of the individual magnetic fields produced by each portion or segment of the antenna or coil conductor. Therefore, the geometry of the inductive antenna or coil significantly determines the spatial distribution of the plasma, and particularly the spatial distribution and uniformity of the plasma ion density within the process chamber. As one example, an antenna having an 'S' shape, such as that disclosed in U.S. Pat. No. 5,669,975, establishes a significant ion density in the central area of the antenna. At higher RF power levels, the outer portions of the antenna will also contribute significantly to plasma ionization. While a significant advantage of an ICP system utilizing such an antenna is the linearity of the system with respect to the power delivered to the antenna and also the radius of the process chamber, and while the current ICP systems and antenna designs utilized therein have provided sufficient plasma generation, such systems still have certain drawbacks.

For example, within the confines of existing ICP systems and antenna configurations, it is difficult to scale the process chamber to a larger size for handling larger substrates without significantly increasing the dimensions of the antenna or coil. An ICP antenna with a larger footprint must be accommodated with expensive modification to the processing system. Furthermore, larger antennas and their associated plasmas exhibit greater sensitivity to process parameters within the chamber. For example, the plasma process, such as an etch or deposition process, becomes more sensitive to process parameters such as the substrate-to-target distance within a sputtering system, the target material within a sputtering system, the pressure within the process chamber, and the height and width configuration of the chamber.

Furthermore, current ICP systems utilizing planar spiral antennas have exhibited asymmetry wherein the distribution of the plasma is not aligned with the central axis of the chamber. Such plasma asymmetry degrades the uniformity of the plasma and the uniformity of the deposition or etch process, thereby affecting the overall system efficiency. Still further, planar antennas may exhibit a ring or doughnut-shaped plasma for one process and corresponding set of parameters, while creating a centrally peaked plasma for another process and other parameters. Accordingly, the plasma shape and uniformity is not consistent within such ICP systems and will be process dependent. Therefore, the overall IC fabrication process will not be consistent from one plasma process to another plasma process.

Another drawback with planar antenna systems utilizing an S-shaped antenna or coil, is that the outer portions of the coil marginally affect the plasmas created by the central region of the coil, thus giving an azimuthal dependence within the plasma, and a corresponding azimuthal dependence in the etched or deposited films on the substrate. That is, along one axis of the plane defined by the coil, the plasma will have a different uniformity and density than along another planar axis of the coil.

Another concern with inductively coupled plasmas is to ensure that energy is predominantly inductively coupled into a plasma rather than predominantly capacitively coupled. Capacitive coupling between the inductive element and the plasma is undesirable. While Faraday shields may be used to reduce capacitive coupling, it is still desirable to improve on the design of such shields within a processing system.

Accordingly, it is an objective of the present invention to overcome drawbacks in the prior art and provide a plasma processing system, and particularly an ICP system, in which a dense, uniform plasma is created.

It is another objective of the present invention to provide a uniform plasma which is less dependent upon the size and shape of the process chamber than current plasma processing systems.

It is still another objective to provide a plasma which is symmetrical in the processing chamber.

It is another objective to reduce capacitive coupling within an ICP system.

It is another objective of the present invention to provide a uniform, dense plasma over a large area, such as an area sufficient to handle a 200 mm or greater wafer, while maintaining a compact and inexpensive design of the inductive coil or antenna.

It is still another objective of the present invention to provide consistent plasma generation and thereby provide consistent processes, such as etch processes and deposition processes, which are less dependent upon process parameters, such as pressure and/or chamber geometry or size.

One attempt to address various of the above objectives utilizes a processing system incorporating unique inductive elements therein. Specifically, U.S. patent application Ser. No. 09/277,526, entitled Process, Apparatus and Method for Improving Plasma Distribution and Performance in an Inductively Coupled Plasma, and filed on Mar. 26, 1999, now U.S. Pat. No. 6,237,526, illustrates such systems. That patent is incorporated herein by reference in its entirety. While the processing systems and inductive elements disclosed therein provide for the creation and use of effective inductively coupled plasmas, it is still desirable to improve and further refine such systems for improved ICP characteristics. As such, the present invention addresses the above objectives and other objectives and is set forth in greater detail below.

SUMMARY OF THE INVENTION

A processing system for processing a substrate with an ionized plasma comprises a processing chamber defining a processing space with a substrate support therein for supporting a substrate in the processing space. A gas inlet introduces process gas into the space and a plasma source is operable for creating an ionized plasma therein. In accordance with one aspect of the present invention, the plasma source comprises an inductive element operable for coupling electrical energy into the processing space to create an ionized plasma therein. The inductive element winds around a portion of the processing space inside the processing chamber such that the inductive element is internally contained. In that way, the inductive element is exposed directly to the plasma in the processing space, rather than having to couple electromagnetic energy through a portion of the processing chamber.

In accordance with one embodiment of the present invention, the inductive element is encased inside a dielectric material to physically separate the element from the processing space while allowing the element to couple electrical energy into the processing space. In one example, a dielectric material assembly includes an inner subassembly, an outer subassembly, and a middle subassembly. The inductive element is configured around the middle subassembly, wherein the outer subassembly isolates the inductive element from the grounded processing chamber, while the inner subassembly isolates the inductive element from the processing space and plasma.

The present invention may be suitably used with a number of different inductive element shapes. One suitable shape comprises a coil with multiple coil turns wherein the turns include segments oriented along a chamber sidewall portion and segments oriented along a chamber end wall portion for coupling energy simultaneously into the processing space through both the sidewall and end wall portions of the chamber.

In another embodiment of the invention, a dielectric envelope is positioned within the processing space and surrounds a portion of the inductive element. The envelope encases the element against the processing chamber and isolates the element from the processing space. A dielectric epoxy or other suitable insulating material fills the inside of the envelope for further encasing the inductive element.

In accordance with another embodiment of the present invention directed to an inductive element positioned internally in the chamber, a DC electrical energy source is electrically coupled to the inductive element at a point along the inductive element, and a ground reference is electrically coupled to the inductive element at another point along the inductive element. The DC source is operable for enhancing the magnetization of the inductive element to reduce the capacitative coupling of energy between the inductive element and the plasma, thereby protecting the inductive element exposed to the plasma and the processing space of the chamber. Inductors are electrically coupled between the inductive element and the DC source and ground to further enhance the magnetization of the inductive element.

In accordance with another aspect of the present invention, an electrostatic shield is utilized with the plasma source to enhance inductive coupling of energy into the processing space. The electrostatic shield comprises a body having opposing face surfaces wherein at least one bore is formed in the shield along the body and between the face surfaces. A slot is formed in each of the face surfaces proximate the bore and communicating with the bore to form a passage through the shield. The shield enhances inductive coupling and the unique slots prevent a line-of-sight pathway therethrough to effectively trap particles that might otherwise penetrate the shield and generally prevent transmission of plasma particles through the shield.

Other aspects of the present invention will become more readily apparent from the figures and detailed description below.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1:
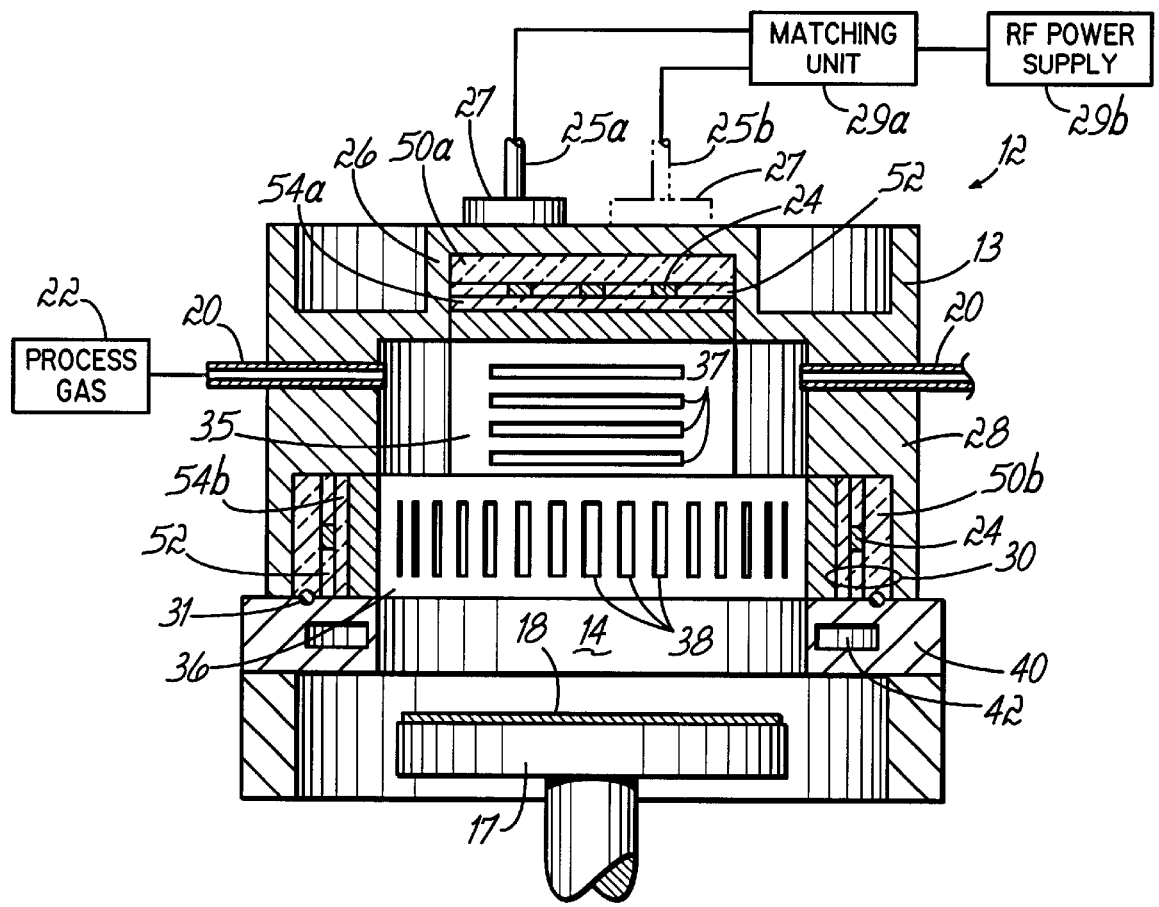
FIG. 1 is a front cross-sectional view of a processing system in accordance with one aspect of the present invention.

FIG. 1 illustrates in cross-section a processing system 12 in accordance with one embodiment of the present invention. System 12 includes a processing chamber 13 which defines a processing space 14 therein. Processing system 12 and the concept embodied therein would be suitable for use with a variety of inductive elements, such as the inductive elements shown and described in U.S. patent application Ser. No. 09/277,526 now U.S. Pat. No. 6,237,526. One possible inductive element is shown in system 12 for illustrative purposes and is not meant to be limiting. A substrate support 17 in space 14 is configured for supporting a substrate 18 to be processed. The substrate support 17 could be any appropriate support and may be associated and operably coupled with other subsystems (not shown) which are known in the art, such as an electrostatic chuck device, an RF or DC biasing source, a heater, and back plane gas system. One or more inlets 20 are coupled to a process gas supply 22, such as an argon gas supply, for introducing a process gas into the processing space 14 to form a plasma.

Chamber 13 is a vacuum chamber which is sealed against atmospheric pressure. Accordingly, chamber 13 will be coupled to an appropriate vacuum or pumping system (not shown) as is known in the art. In the present invention, the plasma source is immersed in the vacuum processing space 14. The source, comprising an inductive element, dielectric material encasing the inductive element, and one or more electrostatic shields, couples energy directly into the processing space from inside of the chamber. Therefore; the chamber may utilize a full metal design. Generally the chamber will be grounded. The internal dimensions and shape of the chamber will fit the shape of the elements of the plasma source to eliminate any stray plasma discharges away from the processing space 14 and the substrate 18 to be processed. Chamber 13 may have a circular shape, or any other appropriate shape suitable to process a substrate. Furthermore, the plasma may be a unitary structure or multiple structures which couple together. For example, the plasma source may be coupled in one structure or module which then mounts to a main chamber housing the substrate support 17. Furthermore, as discussed hereinbelow, for iPVD processes, targets will also be appropriately mounted with the chamber to be exposed to the plasma in processing space 14.

System 12 includes one embodiment of a suitable inductive element 24 which extends simultaneously around the top wall 26 and sidewall 28 inside chamber 13 and within the processing space 14. In many conventional systems, the inductive element is external of the chamber 13 and space 14. In accordance with one aspect of the present invention, the inductive element 24 is internally located in chamber 13 and is directly exposed to the processing space 14 and any plasma therein. In one embodiment of the invention, the element 24 is encased inside dielectric material to physically separate the element from space 14 and any plasma sustained therein. The encased element 24, however, is still operable for coupling energy directly into the plasma through the dielectric material, because the inductive element is internally located, with respect to processing space 14. The chamber 13 may be made completely of a suitable metal, such as stainless steel, without the need for a dielectric window or other dielectric portion as part of the chamber.

As noted, the inductive element may be any of several inductive elements disclosed herein or in U.S. patent application Ser. No. 09/277,526 now U.S. Pat. No. 6,237,526. The inductive element 24 is coupled through an appropriate matching unit 29a to a source of electrical energy, such as RF power supply 29b, which biases the inductive element 24 to create varying RF magnetic fields in the processing space 14 for forming a plasma (not shown) therein, in accordance with known ICP principles. The matching unit is an electrical circuit well known to those of ordinary skill in the art to accommodate the impedances of the RF power supply 29b and the inductive element 24 to provide maximum delivered power to the element 24 and into a plasma under various conditions. The plasma is then utilized for processing substrate 18, such as by plasma etching or deposition, according to principles and techniques well known to a person of ordinary skill in the plasma processing art.

Figure 1A:
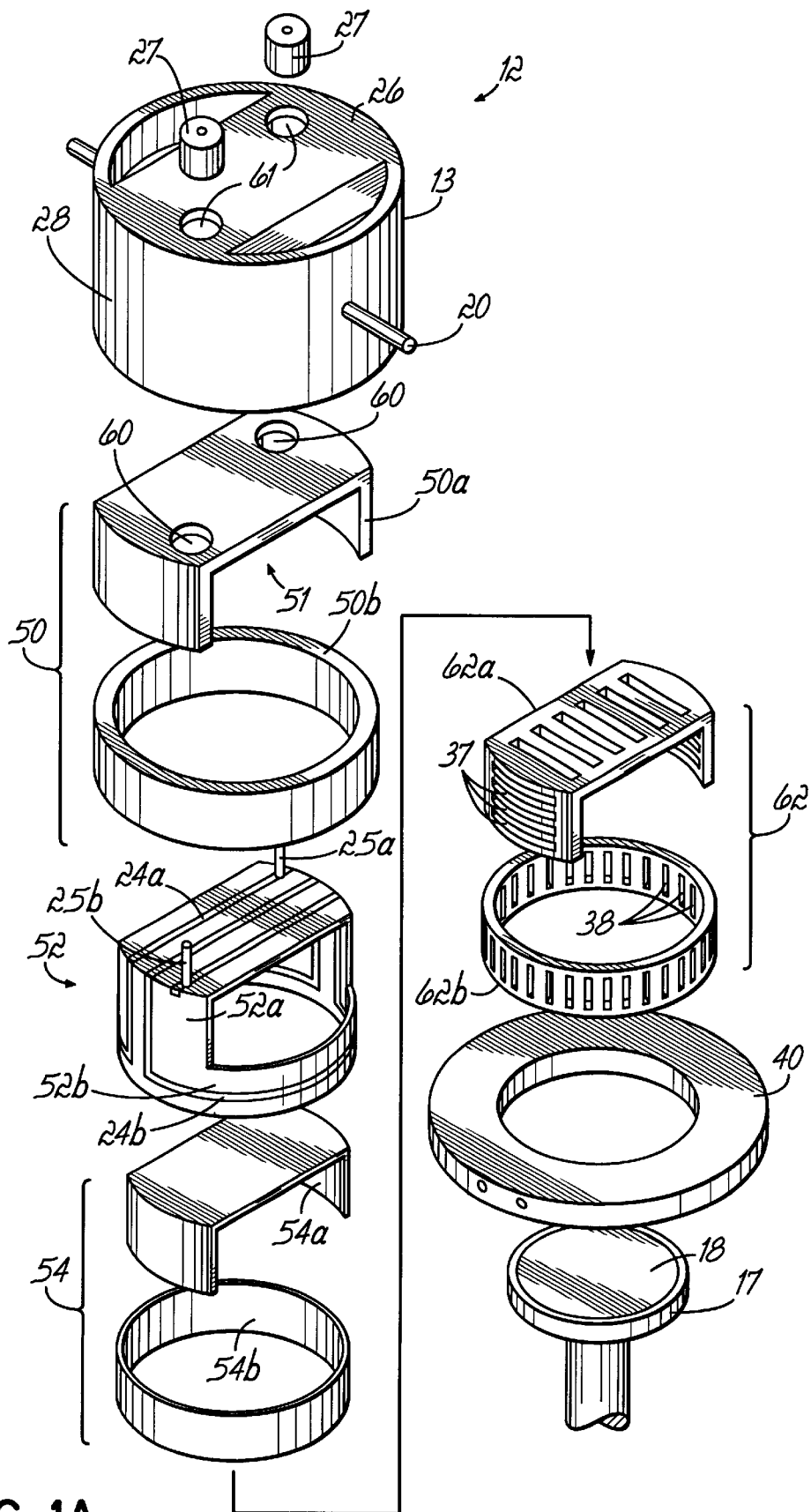
FIG. 1A is an exploded perspective view of elements of the processing system illustrated in FIG. 1.

The inductive magnetic fields, created by RF currents within the inductive element 24, are coupled into space 14 through a dielectric structure 30 encasing element 24. The structure 30 is formed of a dielectric material and encases the element and protects it from the plasma in space 14. In one embodiment, as shown in FIGS. 1, 1A, the structure 30 includes multiple pieces which cooperate.

To enhance inductive coupling into processing space 14, one or more Faraday shields might be used. An upper Faraday shield 35 is shown positioned proximate an upper portion of the chamber and the processing space and a lower Faraday shield 36 is positioned in the chamber proximate a lower portion of the space 14. The Faraday shields are placed between any inductive elements, such as element 24, and the processing space 14 where the plasma is generated. Faraday shields are known in the art and effectively provide improved inductive coupling of energy from element 24, across the dielectric window, and into the processing space. Faraday shields also reduce undesired capacitive coupling between the inductive elements and the plasma.

Generally, the Faraday shields will include a plurality of slots 37, 38 formed in the shields, as illustrated in shields 35, 36 of FIG. 1. The slots 37, 38 are oriented generally perpendicular to coil turns of the inductive element 24.

Returning to FIG. 1, the inductive element 24, which might also be referred to as an antenna, is shown in the form of a coil having multiple coil turns. The terms "inductive element" and "antenna" are used interchangeably herein. The inductive element is formed of an electrical conductor according to principles known in the art. The conductor, such as elongated metal wire or metal tubing, is configured and shaped in accordance with the principles of the present invention to form an element which will inductively couple energy into a processing chamber when an electrical current is passed through the element. The conductor is wound or shaped as desired, depending upon the processing space, substrate and plasma parameters which are required, for example.

Referring again to FIG. 1, processing system 12 also incorporates a cooling ring 40 having an internal cooling passage 42 through which water or another cooling liquid may be passed. Cooling ring 40 may be utilized to cool the processing chamber 13 during plasma processing. Other cooling apparatus might also be used. Processing chamber 13 will also be coupled to an appropriate vacuum system (not shown), as noted. Chamber 13 further includes appropriate feed-throughs for the opposing terminals 25a, 25b of the inductive element 24. Insulators 27 insulate the terminals from the grounded processing chamber 13. Furthermore, in accordance with known principles, the processing system will generally incorporate control and monitoring systems necessary for a plasma processing system such as a pressure control system, an electrostatic chuck temperature control system, and other systems (not shown) which would be known to a person of ordinary skill in the art.

In accordance with one aspect of the present invention, the dielectric structure 30 encasing the inductive element includes multiple pieces which nest together to encase the element 24 and prevent stray plasma discharges outside of the main processing space proximate substrate 18. Referring to FIG. 1A, an exploded view of components of system 12 are shown. Specifically, the embodiment of dielectric structure 30 illustrated includes an outer dielectric subassembly 50, a middle subassembly 52, and an inner subassembly 54. In the embodiment illustrated, the inductive element 24 is wound around the middle subassembly as shown. To that end, the various subassemblies 50, 52, and 54 which encase the inductive element are appropriately shaped depending upon the shape of the inductive element which is utilized. As noted, the inductive element may take various different appropriate shapes. Inductive element 24 illustrated in FIGS. 1 and 1A utilizes a series of coils which wind and extend proximate both the top wall 26 and side wall 28 of the processing chamber 13 inside the chamber. Therefore, each subassembly generally includes a top or upper portion and a'side portion. Those portions may be unitary or separate pieces, as shown. Specifically, outer subassembly 50 includes portions 50a and 50b which cooperate with each other to encase the various coil turns of element 24. Specifically, inductive element 24 includes coil turns which also have top coil portions 24a and side coil portions 24b. To that end, portion 50a of the subassembly 50 is used to encase the top coil portions and also part of the side coil portions, while portion 50b of subassembly 50 is used to encase side coil portions 24b. Accordingly, the various portions 50a, 50b of the subassembly 50 are dimensioned for cooperating to encase the inductive element 24. It will be understood that the sub-assemblies may take other shapes in accordance with the invention, depending upon the inductive element used. Subassembly 52 is shown as a unitary piece including a top portion 52a and a side portion 52b. Inductive element 24, in the form of a coil, is actually wound around subassembly 52. Subassembly 52 is then dimensioned to nest inside of subassembly 50, as illustrated in FIG. 1.

Similarly, the inner subassembly 54 includes a top portion 54a and a side portion 54b. Portions 54a and 54b are configured and dimensioned to cooperate and to nest inside of subassembly 52, as illustrated in the Figures. With all of the subassemblies nested together, the element 24 is encased and is isolated from a plasma in processing space 14.

Inductive element 24 and the various subassemblies, 50, 52, and 54, which encase the inductive element within the plasma processing space, all are suitably dimensioned in accordance with known principles for providing a desirably dense plasma within the processing space. The plasma flux, utilizing an inductive element shaped like 24 shown in the figures, is affected by ratios between the diameter and height of the inductive element, as reflected by the dimensions of the coil turns. Therefore, a suitable dimension may be empirically determined for the encased inductive element 24. Generally, a cooling fluid, such as water, will be circulated through the inductive element. To that end, inductive element 24 may utilize a hollow pipe-like conductor which is wound in the desired shape.

As illustrated in FIG. 1A, the inner dielectric subassembly 54 may be relatively thin compared to subassembly 50, and may have a wall thickness in the range of approximately 3–6 mm. The element 24 is shown wound around subassembly 52. Subassembly 52 separates the inductive element from the plasma within processing space 14. Subassembly 52 may utilize grooves therein, either externally or internally, along which the conductor forming inductive element 24 is shaped, as illustrated in FIG. 1A. That is, the conductor is wound around grooves within subassembly 52 for forming the desired shape of the inductive element 24. Subassembly 52 provides mechanical support for the inductive element. The thickness of subassembly 52 may be suitably determined. For example, the dielectric assembly 52 with a wall thickness in the range of 5–10 mm may be suitable for mechanically supporting the inductive element.

The inductive element 24 must also be separated from the grounded processing chamber 13. To that end, subassembly 50 is generally thicker than the other subassemblies encasing the inductive element. For example, subassembly 50, and specifically portions 50a and 50b thereof, may have a wall thickness of greater than 20 mm. The various subassemblies, 50, 52, and 54, are shaped appropriately for adequately encasing and supporting the inductive element 24 while preventing a plasma from being struck and maintained within the dielectric structure 30 wherein it might affect the inductive element 24. Top portion 50a of subassembly 50 includes appropriately formed apertures 60 to align with aperture 61 in the processing chamber 30 for the insulative elements 27 and the pass-through of the inductive element terminals 25a and 25b through the subassembly 50 and processing chamber 13. To that end, the dielectric structure 30 encasing the inductive element 24 will also protect the insulative elements from the sputtering or coating associated with the plasma process being performed.

The dielectric subassemblies may be formed of a suitable ceramic material. The inner subassembly 54 may be quartz. Quartz provides optimum results for RF field coupling from element 24.

An electrostatic shield assembly 62 comprises a top electrostatic shield 62a and a side shield 62b. The shields are appropriately slotted with slots 37 and 38, as discussed above. The shields 62a, 62b are configured and dimensioned to further nest inside of the inner subassembly 54 between the inductive element 24 and the processing space 14. While the shields 62a and 62b are shown in separate pieces, they might also be fabricated as a single, or unitary piece.

Within an iPVD system, material is sputtered from a target and is then further ionized before being deposited on a substrate 18. To that end, in accordance with another embodiment of the present invention, the processing chamber 13 might be appropriately configured for housing one or more targets of material to be sputtered. Referring to FIG. 2, the processing chamber 13 might be configured to have openings or apertures 66 therein for receiving one or more target assemblies. Each of the subassemblies, 50, 52, 54 and the shield assembly 62 are appropriately formed to expose the target assembly 68 to the plasma processing space 14 and the plasma therein for the purposes of sputtering. To that end, the top portions or sections of the assemblies are open to couple the targets with the processing space 14. For example, in subassembly 50, top portion 50a has cut-out sections 51 on either side through which the target assembly 68 may extend into the processing space. The other subassemblies and electrostatic shield assembly are similarly formed with appropriate cut-out sections for providing access between the processing space 14 and the target assembly 68, as illustrated in FIG. 2.

Figure 2A:
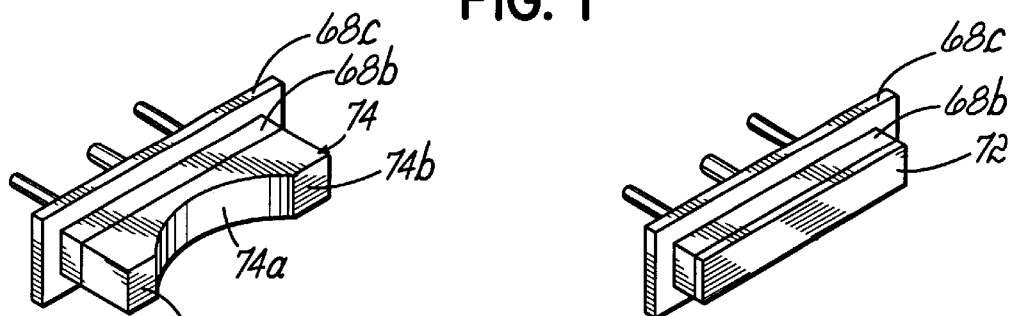
FIGS. 2A, 2B, and 2C are perspective views of targets which may be utilized with the embodiment of the processing system illustrated in FIG. 2.
Figure 2B:
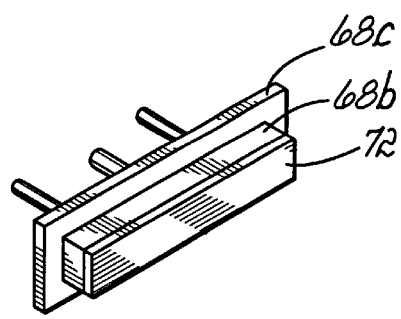
Figure 2C:
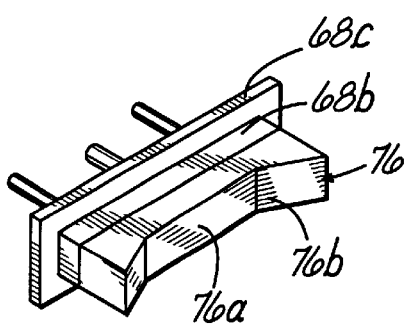
Figure 2:
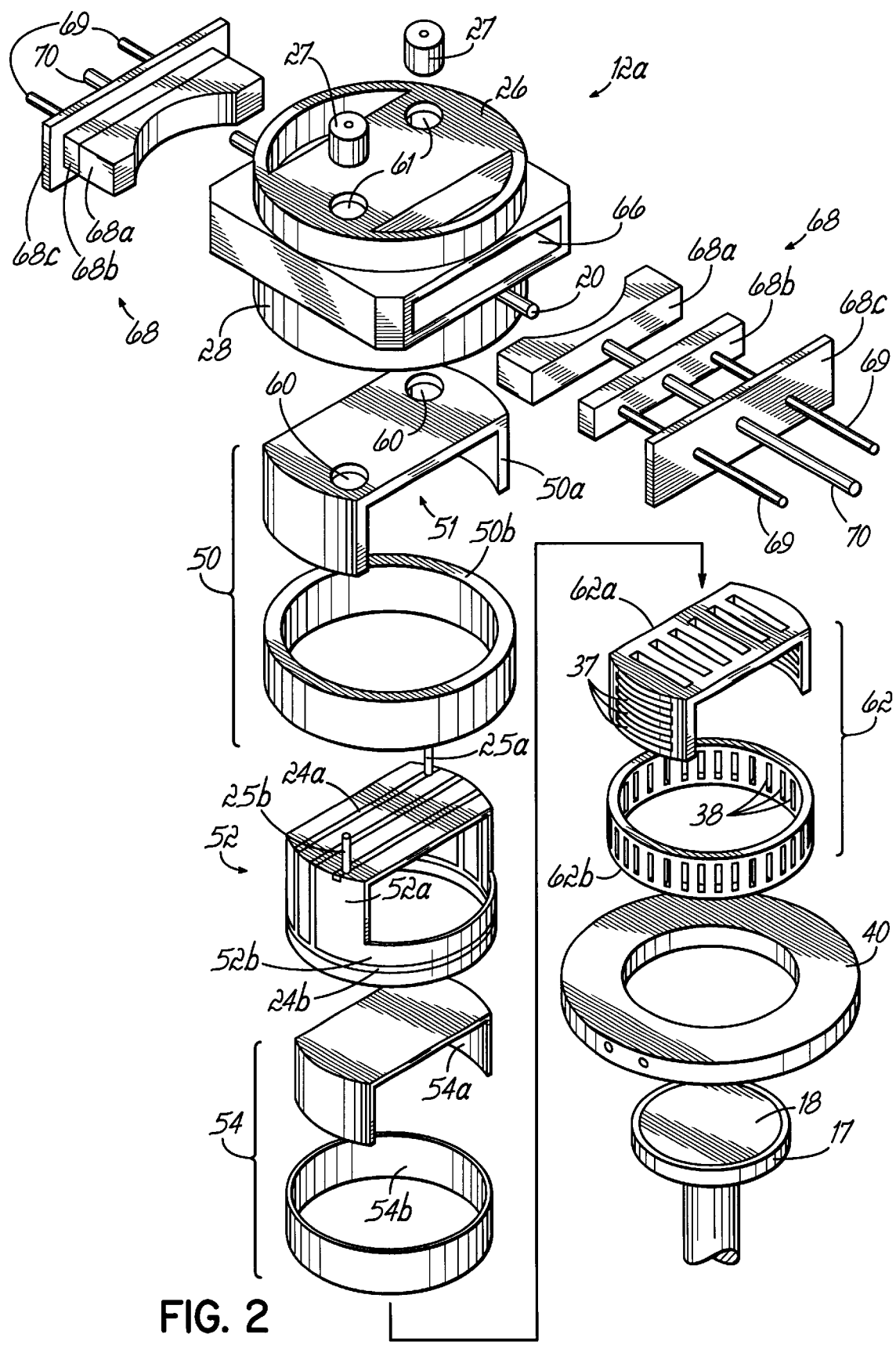
FIG. 2 is an exploded perspective view of an alternative embodiment of the present invention.

Referring to FIG. 2, and also FIGS. 2A, 2B, and 2C, each target assembly may include an appropriate target 68a of material to be sputter deposited upon substrate 118. The target 68a is appropriately attached to a cooling plate 68b through which cooling fluid is circulated by means of a circulation system 69. The cooling plate 68b is fixed to a back plate 68c. Generally, the target material 68a is DC biased. Therefore, an appropriate DC connection 70 is coupled to target 68a through plates 68b, 68c and to an appropriate DC power supply (not shown). FIGS. 2A, 2B, and 2C illustrate various different shapes of targets which may be utilized within the system of 12a, illustrated in FIG. 2 for desired deposition parameters. For example, the target might be a flat target 72, as illustrated in FIG. 2B. Alternatively, the target might have a concave shape, as illustrated in FIGS. 2A and 2C. Target 74 in FIG. 2A has a concave surface 74a relative to the end surfaces 74b. Such a design might be utilized when the target within the system tends to wear greater on the ends than in the middle. Similarly, as shown in FIG. 2C, target 76 has a concave surface formed by surface 76a and angled surfaces 76b. The concave shape of the targets will modify and improve the directivity of the sputtered flux from the target toward the central processing (ionization) zone. Therefore, the concave-shaped targets provide better geometrical confinement of the sputtered particles.

Figure 3:
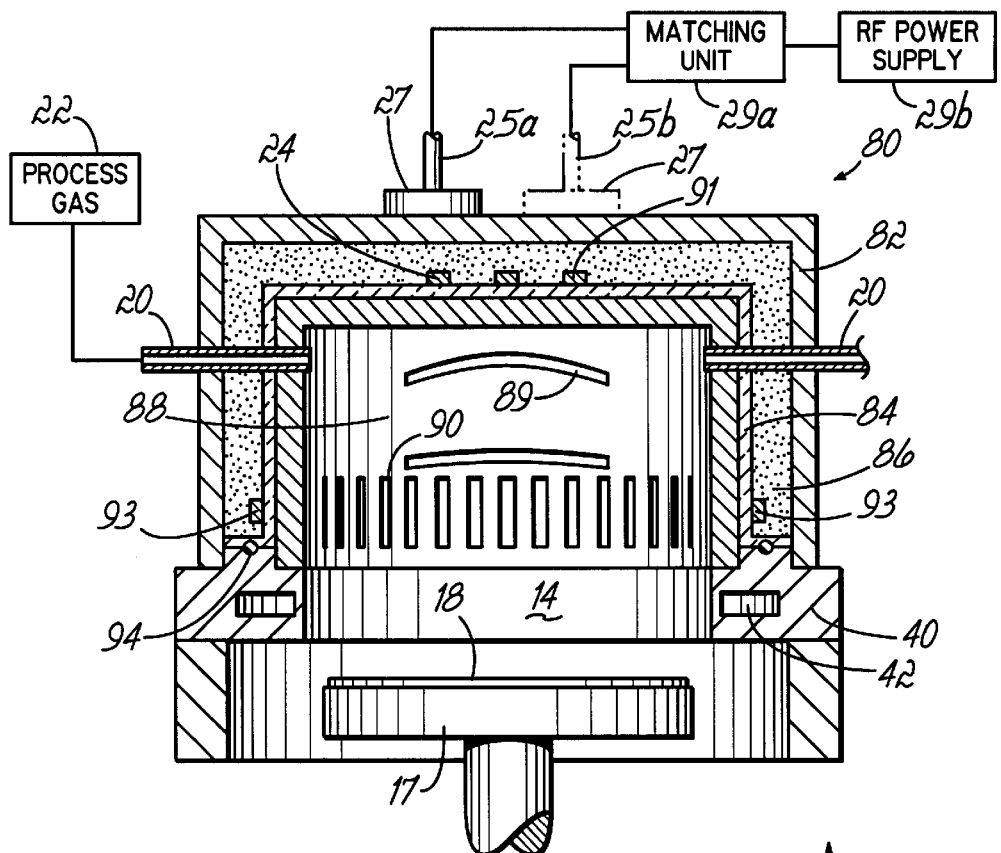
FIG. 3 is a front cross-sectional view of another alternative embodiment of the present invention.

FIG. 3 illustrates another embodiment of the present invention wherein the inductive element is encased inside dielectric material to physically separate the element from the processing space while allowing the element to couple electrical energy into the processing space. The inductive element is located inside of the processing chamber and is thereby exposed directly to the plasma environment. Specifically referring to FIG. 3, the processing system 80 incorporates a processing chamber 82. System 80 and processing chamber 82 will incorporate various similar components as illustrated in system 12 of FIG. 1 discussed hereinabove for accomplishing plasma processing, such as etching or deposition. To that end, like elements, which have previously been discussed with respect to FIGS. 1, 1A, and 2, will be given similar reference numerals in FIG. 3, even though the shape of one or more of those elements may be slightly different due to the alternative embodiment illustrated within FIG. 3.

In FIG. 3, the dielectric material encasing the inductive element comprises a dielectric envelope 84 which surrounds the inductive element 24 along the top wall and side wall of chamber 82. The envelope 84 may be made of quartz or some other suitable ceramic material. Envelope 84 is constructed in accordance with the internal shape of chamber 82, and also the shape of the inductive element. To that end, the envelope 84 may take various suitable forms in accordance with the principles of the present invention and depending upon the shape of the inductive element. Envelope 84 cooperates with chamber 82 to provide a volume in which the inductive element 24 is encased. In accordance with another aspect of the present invention, the volume is filled with an epoxy 86 which surrounds inductive element 24 and further encases the inductive element within a dielectric material. Preferably, the epoxy is filled into the envelope 84 in a liquid or semi-liquid form, and then is allowed to dry at a reduced pressure in the chamber. Rough vacuum conditions may be suitable for allowing the epoxy to out-gas while it solidifies. Other suitable insulating materials may be used to fill space inside envelope 84.

The grounded chamber 82 acts as one side of the encasing for the inductive element. Alternatively, additional ground shields (not shown) might be utilized against the top and side walls of the chambers for further encasing the inductive element in the epoxy. A grounded electrostatic shield 88 is positioned on the inside of the envelope 84 as discussed above. FIGS. 1, 1A, and 2 illustrate separate shields for the portions of the inductive element which extend along the side wall and top wall of the chamber. Alternatively, as illustrated in FIG. 3, shield 88 might be a unitary piece with slots 89 for the coil turns 91 extending along the top wall and part of the side wall of chamber 82, and slots 90 for turns 93 extending along the side wall of the chamber. A seal 94 might be utilized between the envelope 84 and the other portions of the chamber, such as the cooling ring 40. A similar seal 31 is shown in system 12 of FIG. 1.

Figure 4:
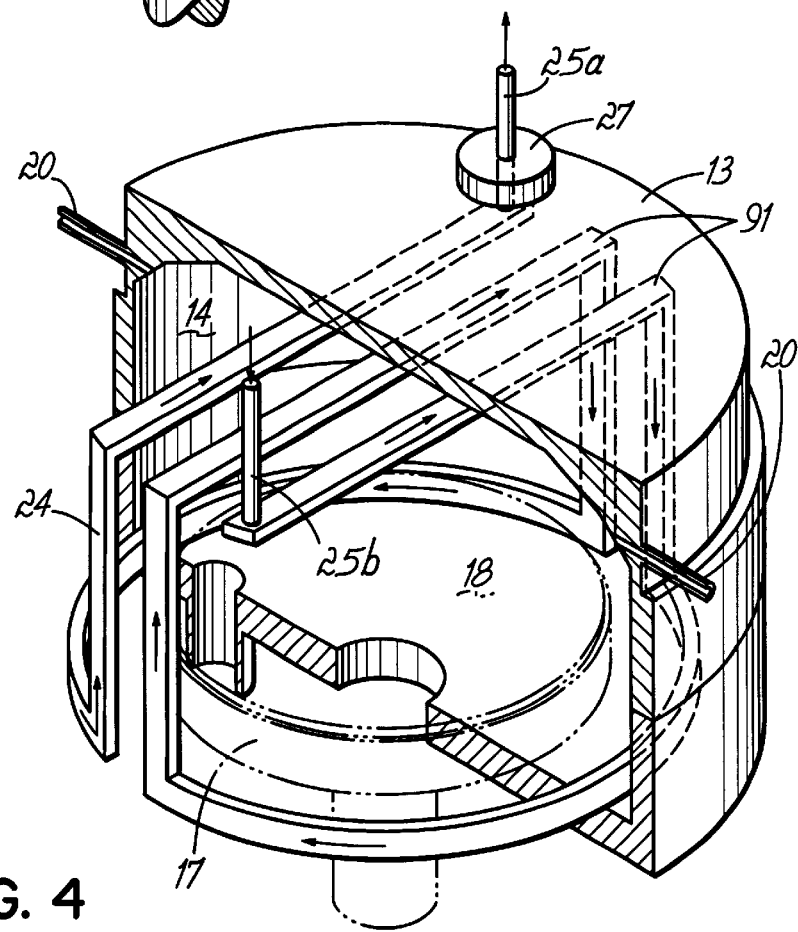
FIG. 4 is a perspective view, partially cut away, of another embodiment of the present invention.

FIG. 4 illustrates another embodiment of the present invention which utilizes a self-magnetized inductive element 24 which is not encased within a dielectric material, yet is positioned inside the processing chamber and is exposed to the processing space. A DC electrical energy source is electrically coupled to the inductive element 24 at a point along the inductive element and a ground reference is electrically coupled to the inductive element at another point along the element. The DC source is operable for enhancing the magnetization of the inductive element to reduce the capacitive coupling of energy between the inductive element and the plasma. In that way, the effects of localized capacitive coupling are reduced and sputtering of the inductive element is also reduced. The inductive element may be exposed directly to the plasma inside of the chamber without being encased in dielectric material.

Figure 4A:
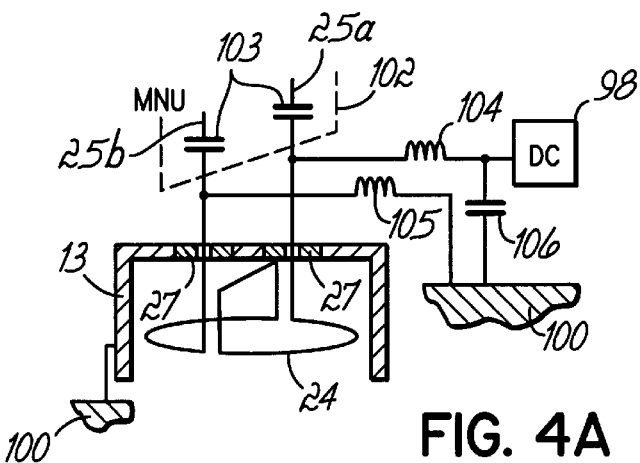
FIGS. 4A, 4B, and 4C are illustrative schematic diagrams of biased networks for an inductive element in accordance with the principles of the present invention.
Figure 4B:
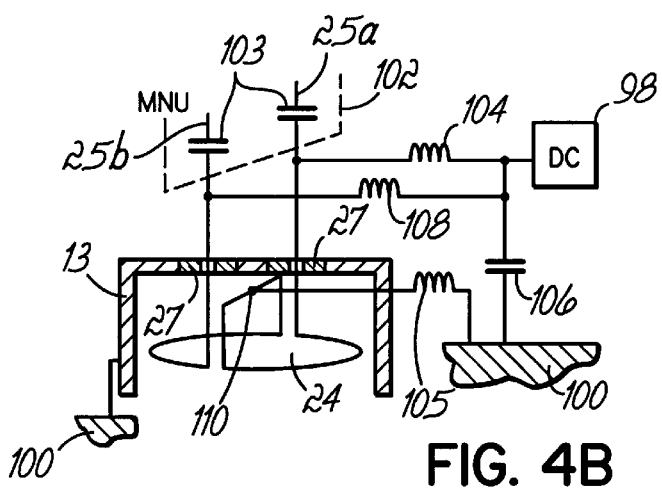
Figure 4C:
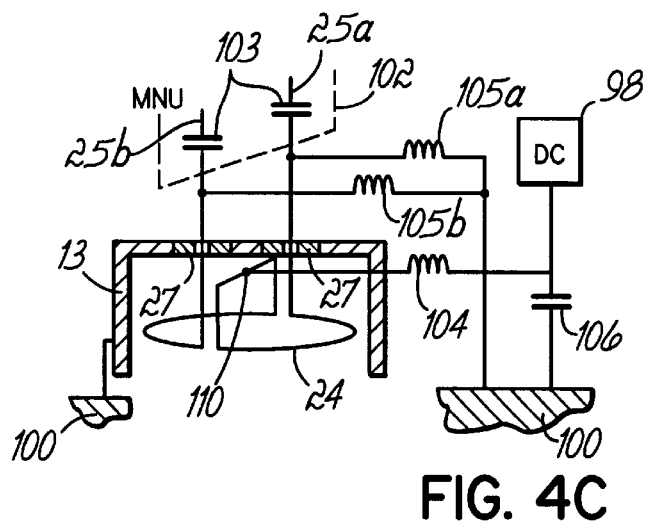

Referring to FIG. 4 where like numerals indicate similar elements, which were earlier discussed, inductive element 24 is positioned inside chamber 13 and is exposed to the processing space 14 without being encased in dielectric material. Therefore, during plasma processing, the inductive element 24 is exposed to the plasma. The inductive element is protected electrically rather than being physically covered. FIGS. 4A, 4B, and 4C illustrate various embodiments of the invention wherein the inductive element is DC biased in different ways to operate in a push-pull configuration. Such a configuration creates conditions wherein the conductive element acts as a one-half wave resonator. To that end, inductors and capacitors are coupled between the DC power supply and the terminals of the inductive element and other points along the element at which the DC power supply or a ground reference are coupled.

Referring specifically to FIG. 4A, a DC source 98 is coupled to one point along the inductive element, such as terminal 25a. Another point along the inductive element, such as terminal 25b is grounded to a ground reference 100. Inductive element 24 is RF biased by an RF power supply (not shown in FIG. 4A) which is coupled to element 24 through a suitable matching network 102. The matching network 102, or MNU, will usually contain various capacitive elements 103 for desired frequency matching. The DC power supply 98 is coupled to terminal 25a, through inductor 104, and terminal 25b is also grounded through an inductor 105. A capacitor 106 extends between the DC source 98 and the ground reference 100. The chamber 13 is also grounded. Utilizing the circuit configuration as illustrated in FIG. 4A, the capacitive currents within the inductively coupled plasma may be compensated inside of the inductive element 24. Preferably, the plasma will not have any significant capacitive coupling to the ground reference at the excitation frequency utilized to excite the inductive element. Therefore, the plasma potential is expected to be low. The configurations illustrated in FIGS. 4A, 4B and 4C enhance magnetization of the inductive element 24 and thereby provide a plasma electron confinement. That is, electron losses from the plasma are reduced. In that way, the effects of localized capacitive coupling between the inductive element 24 and a plasma are reduced, and sputtering of the inductive element 24 by the plasma is also reduced. It is also anticipated that the embodiments illustrated in FIGS. 4, 4A, 4B, and 4C will also enhance the density of the plasma within chamber 13 when the magnetic field in the inductive element 24 produced by the DC current bias reaches a suitable value to create what are referred to in the art as "whistler waves." The inventor anticipates that a DC created magnetic field of approximately 50 gauss with an inductive element 24 may induce such whistler wave enhancement.

FIG. 4B illustrates another embodiment of the invention wherein the DC source is coupled to both of the terminals 25a, 25b through inductors 104, 108. That is, both of the opposing terminals of inductive element 24 are electrically coupled to the DC source 98. A point along the inductive element 24 between the opposing terminals 24a, 24b is then coupled to a ground reference through inductor 105, as illustrated in FIG. 4B. For example, the grounded point 110 might be midway between the opposing terminals 25a, 25b of the inductive element 24. FIG. 4C illustrates yet another embodiment wherein the DC source is coupled to point 110 between the terminals, whereas the terminals 25a, 25b are grounded through inductors 105a, 105b.

FIGS. 5, 5A, 5B, and 5C illustrate, in accordance with another aspect of the present invention, electrostatic shields for reducing capacitive coupling between the inductive element and a plasma within a processing chamber.

Specifically, electrostatic shields of the invention utilize a unique construction which improves plasma ignition, allows a low power capacitive plasma to be sustained, is not particularly complex to manufacture and may be adequately cooled. It is often desirable to maintain a capacitive plasma at very low RF power levels (below 100 Watts) during loading and unloading wafers from a processing chamber. Sustaining such plasma may also reduce particle contamination, provide for an easy restart of the plasma, and may also provide for very fast transformation of capacitive discharge into an inductively coupled mode, thus eliminating an extra electrode which is usually necessary for igniting plasma, such as in iPVD.

Figure 5:
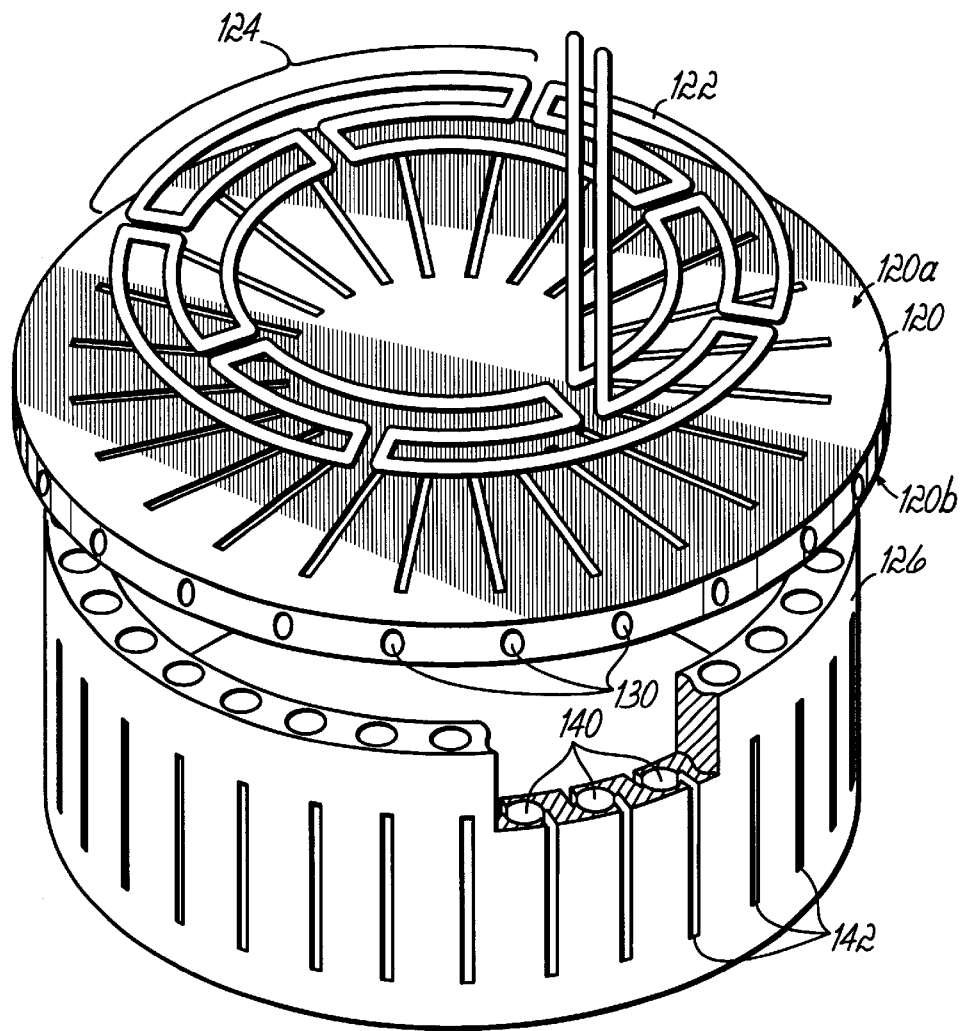
FIG. 5 is the perspective view of electrostatic shields and inductive elements in accordance with one embodiment of the present invention.

FIG. 5 illustrates two electrostatic shield embodiments formed in accordance with the principles of the present invention. Shield 120 may be utilized with an inductive element 122 which utilizes a ring-shaped pattern of repeated element segments 124. Similar alternative of such inductive elements are described in U.S. patent application Ser. No. 09/277,526. Shield 120 will generally be positioned proximate a top wall of a processing chamber, and will be suitably encased in a dielectric material in accordance with the invention.

Shield 126 may be utilized to extend around the side walls of a processing chamber to be utilized with a cylindrical or helical inductive element, such as a helical coil (not shown). In both cases, with shields 120 and 126, the various slots formed in the shield are generally perpendicular to the conductor segments of the inductive elements, such as inductive element 122.

Figure 5A:
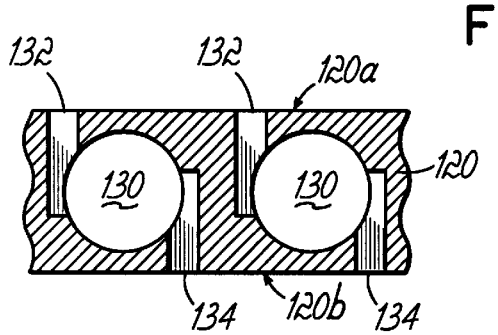
FIGS. 5A, 5B, and 5C illustrate bore and slot patterns for an electrostatic shield in accordance with the principles of the present invention.
Figure 5B:
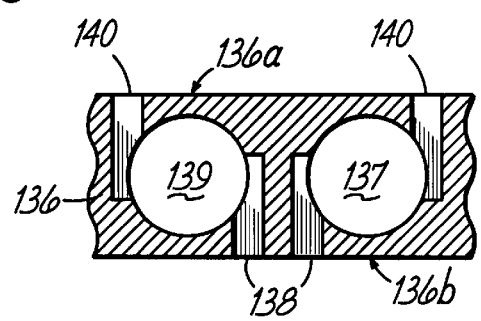
Figure 5C:
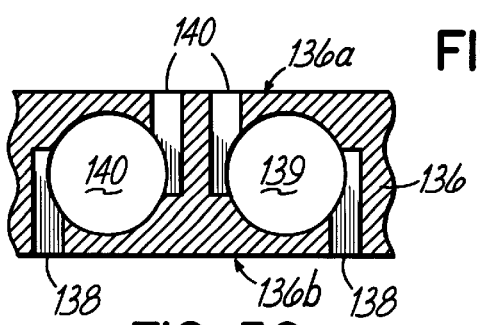

In forming the shields 120, 126, a metallic shield made of a non-magnetic electrically conductive material, such as copper or silver plated copper, is drilled, forming holes therein. Other materials, such as aluminum or molybdenum may be used. Generally, the shield should inhibit contamination in the chamber due to flaking of sputtered material from the shield and thus it should have good adherence properties and should be compatible with any chemical processes. Various bores 130 are drilled in shield 120 and extend radially out from a center of the shield within the plane of the shield 120. Slits 132 are then formed in opposing face surfaces 120a, 120b of the shield. The slits are formed to cooperate with the bores 130. The slits in opposing face surfaces are positioned on opposite sides of the bores, so that no line-of-sight paths exist through the shield. (See FIGS. 5A, 5B, and 5C.) Various different orientations of the slots with respect to adjacent bores are shown in FIGS. 5A, 5B, and 5C. For example, in FIG. 5A, the slots 132 are positioned in the face surface 120a on the side of a bore 130 opposite slots 134 formed in face surface 120b. FIG. 5A illustrates an embodiment wherein each of the sets of slots are similarly oriented in adjacent bores. FIGS. 5B and 5C illustrate an alternative design of the shield wherein the slots of adjacent bores are next to each other in the various face surfaces of the shield. That is, every other bore is flipped 180° in orientation, such that the slots of adjacent bores are next to each other in one face surface and more separated in another face surface. Referring to FIGS. 5B and 5C in shield 136, the slots 138 in face surface 136b are directly adjacent to each other between the bores 137, 139, whereas the slots 140 in face surface 136a are more separated. Going to the next adjacent bore 140, as illustrated in FIG. 5C, the slots 140 between the bores 139 and 140 are directly adjacent to each other in face surface 156a, whereas the slots 138 are now more separated in the face surface 136b. The pattern continues, as illustrated in FIGS. 5B and 5C, around the shield.

Referring to FIG. 5, shield 126 is formed similarly with the patterns of bores and slots as discussed above. However, the various bores 140 and slots 142 are oriented generally parallel to the main axis of the cylindrical shield 126.

The shields 120, 126 are mechanically robust and provide no line-of-sight pathway through the shield. In that way, the shields are effective in trapping particles which may otherwise penetrate the shield, and the shields have proven particularly efficient in generally preventing and reducing the transmission of plasma particles therethrough.

Figure 6:
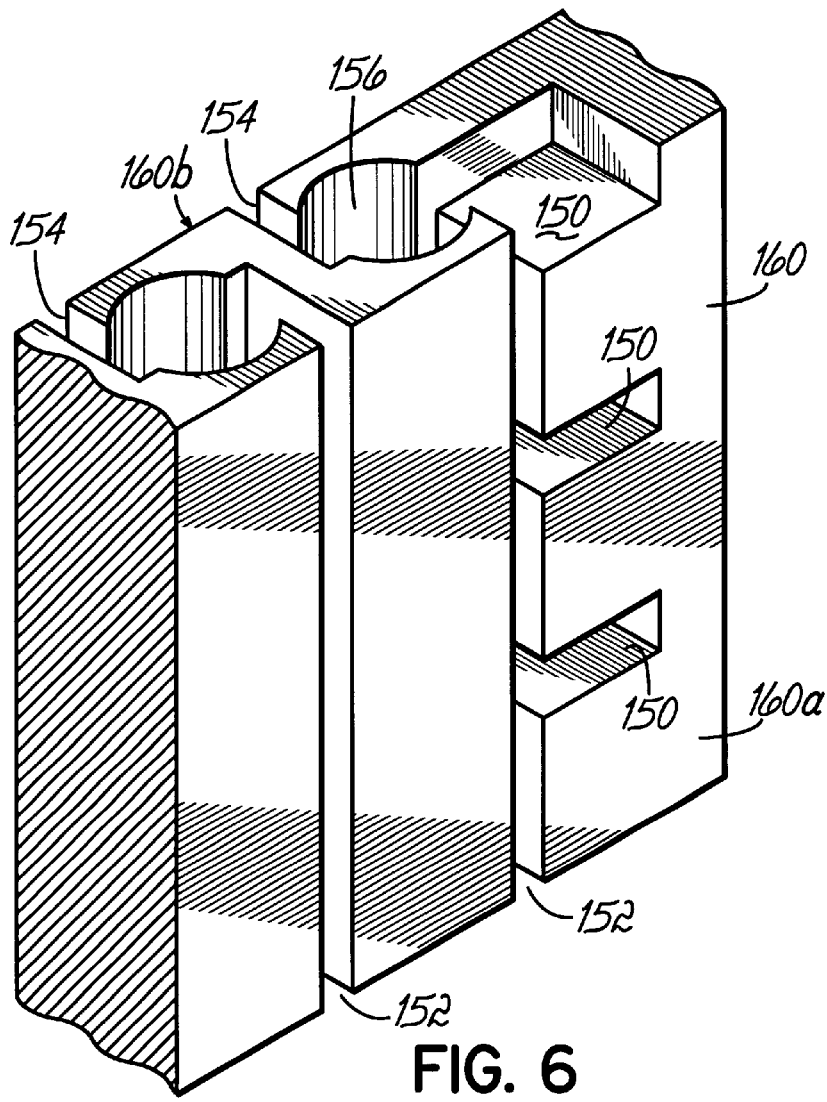
FIG. 6 is a perspective view of a section of an electrostatic shield with an ignition volume in accordance with one aspect of the present invention.
Figure 6A:
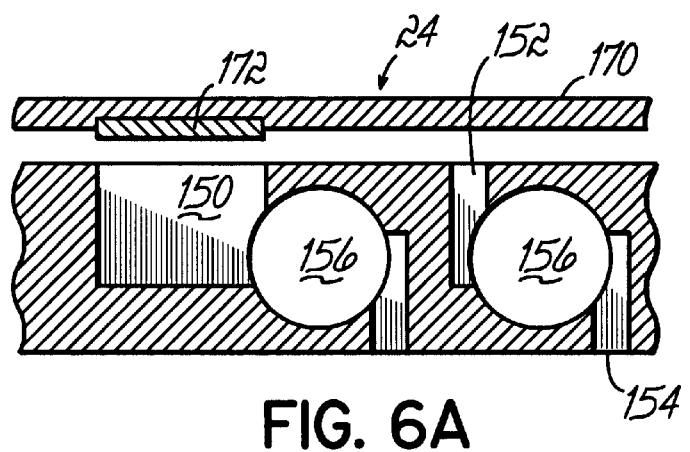
FIG. 6A is a side view, of a cut away portion of an electrostatic shield, as illustrated in FIG. 6.

In accordance with another aspect of the present invention, the shield utilizing the unique bore and slot arrangements, as illustrated in FIGS. 5, 5A, 5B, and 5C, also may be modified to provide an ignition volume for ignition of a plasma at low power levels. Referring to FIGS. 6 and 6A, one or more open spaces may be formed within a shield 160 to couple with one or more of the slots 152 formed therein. Shield 160 is similarly fabricated as discussed above, and includes bores 156 and a plurality of slots 152, 154, formed in the opposing face surfaces 160a, 160b of the shield. The open spaces 150, which may be generally rectangular, for example, as illustrated in FIG. 6, create an ignition volume within the shield 160 to provide for capacitive plasma ignition. The open spaces 150 are formed in the shield 160 on the side of the shield facing the inductive element, such as element 24 discussed above. (See FIG. 6A.) The open spaces provide a larger open area adjacent to one or more of the slots 152 for plasma ignition. At low power levels, such as under 50 Watts, a capacitive plasma will ignite in the ignition volumes or open spaces 150. The highly mobile charged particles of that capacitive plasma, which are assumed to be mostly electrons, will spread out from the ignition volume 150 through the adjacent slot 152 and into the main processing space of the chamber. The plasma from the ignition volumes 150 then strikes and ionizes gas within the processing space. A suitable shield can utilize one or more specific ignition volumes, as shown in FIG. 6.

Furthermore, in accordance with an alternative embodiment of the invention, the conductor segments 170 of an inductive element, which will generally extend perpendicularly to the various slots 152, 154 may be dimensioned larger proximate the ignition volumes 150 for further assisting in the creation of a capacitive plasma. FIG. 6A illustrates an inductive element 24 having an enlarged section 172 directly adjacent to ignition volume 150. In accordance with the principles of the present invention, the electrostatic shield will generally be grounded. However, an electrically floating shield might also be useful in some applications. Furthermore, utilizing the inductive elements without a shield is also possible.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A processing system for processing a substrate with an ionized plasma, the system comprising:

a processing chamber defining a processing space and including a substrate support therein for supporting a substrate in the processing space;

a gas inlet for introducing a process gas into said processing space;

a plasma source operable for creating an ionized plasma in the processing space from process gas introduced therein, the plasma source comprising:

an inductive element operable for coupling electrical energy into the processing space to create an ionized plasma therein;

the inductive element winding around a portion of the processing space inside the processing chamber and comprising a non-helical coil having multiple coil turns, the turns including segments thereof oriented along a chamber sidewall portion and segments thereof oriented along a chamber end wall portion for coupling energy simultaneously into the processing space through both the sidewall and end wall portions of the chamber;

the inductive element being encased inside a dielectric material to physically separate the element from the processing space both along the sidewall portion and end wall portion while allowing the element to couple electrical energy into the processing space.

2. The processing system of claim 1 further comprising a dielectric material assembly configured to surround the inductive element, the assembly comprising an outer dielectric subassembly and an inner dielectric subassembly, the inner subassembly configured to engage the outer subassembly and capture the inductive element therebetween to encase the inductive element in dielectric material.

3. The processing system of claim 2 wherein said inner subassembly is configured to nest partially inside of the outer subassembly.

4. The processing system of claim 2 wherein the dielectric material assembly further comprises a middle subassembly, the inductive element configured around the middle subassembly piece and the middle subassembly is positioned between the inner and outer subassemblies to thereby encase the inductive element.

5. The processing system of claim 2, at least one of the inner and outer subassemblies comprising a first section coupling with the segment oriented along the sidewall portion and a second section coupling with the segment oriented along the end wall portion.

6. The processing system of claim 1 wherein said inductive element comprises a coil having multiple coil turns disposed successively along the length of the coil, at least one of said coil turns being oriented in a first plane, at least one of said coil turns being oriented in a second plane which is angled from the first plane.

7. The processing system of claim 1 wherein said inductive element comprises a plurality of repeated conductor segments arranged in a generally circular pattern around a center axis of the chamber.

8. The processing system of claim 1 further comprising a Faraday shield coupling with the dielectric material to affect the operation of the inductive element.

9. The processing system of claim 1 further comprising an opening in said chamber below at least a portion of said inductive element, a target being positioned in the opening and exposed to said processing space to be sputtered by an ionized plasma.

10. The processing system of claim 1 further comprising a dielectric envelope positioned within the processing space and surrounding a portion of the inductive element, the envelope encasing the element against the processing chamber and isolating the element from the processing space.

11. The processing system of claim 10 further comprising a dielectric epoxy filling the inside of said envelope for further encasing the inductive element.

12. The processing system of claim 10 wherein the dielectric envelope is formed of quartz.

13. A method for processing a substrate with an ionized plasma, the method comprising:
- positioning a substrate in a processing space of a processing chamber;
- introducing a process gas into said processing space;
- positioning a non-helical inductive element inside the processing space of the chamber and coupling electrical energy to the inductive element for creating a plasma from the process gas, the inductive element having multiple coil turns;
- orienting segments of the turns along a chamber sidewall portion and along a chamber end wall portion for coupling energy simultaneously into the processing space through both the sidewall and end wall portions of the chamber;
- encasing the inductive element inside a dielectric material and physically separating the element from the processing space both along the sidewall portion and end wall portion while allowing the element to couple electrical energy into the processing space.

14. The method of claim 13 further comprising encasing the inductive element in a dielectric material assembly comprising an outer dielectric subassembly and an inner dielectric subassembly, the inner subassembly configured to engage the outer subassembly and capture the inductive element therebetween to encase the inductive element.

15. The method of claim 14 wherein the dielectric material assembly further comprises a middle subassembly, the method further comprising configuring the inductive element around the middle subassembly piece and positioning the middle subassembly between the inner and outer subassemblies to thereby encase the inductive element.

16. The method of claim 13 further comprising surrounding a portion of the inductive element with a dielectric envelope positioned within the processing space and encasing the element against the processing chamber.

17. The method of claim 16 further comprising filling the inside of said envelope with a dielectric epoxy for further encasing the inductive element.

18. A processing system for processing a substrate with an ionized plasma, the system comprising:
- a processing chamber defining a processing space and including a substrate support therein for supporting a substrate in the processing space;
- a gas inlet for introducing a process gas into said processing space;
- a plasma source operable for creating an ionized plasma in the processing space from process gas introduced therein, the plasma source comprising:
  - an inductive element operable for coupling electrical energy into the processing space to create an ionized plasma therein;
  - the inductive element winding around a portion of the processing space inside the processing chamber and comprising a non-helical coil having multiple coil turns disposed successively along the length of the coil, at least one of said coil turns being oriented in a first plane, at least one of said coil turns being oriented in a second plane which is angled from the first plane;
  - the inductive element being encased inside a dielectric material to physically separate the element from the processing space while allowing the element to couple electrical energy into the processing space.

19. A processing system for processing a substrate with an ionized plasma, the system comprising:
- a processing chamber defining a processing space and including a substrate support therein for supporting a substrate in the processing space;
- a gas inlet for introducing a process gas into said processing space;
- a plasma source operable for creating an ionized plasma in the processing space from process gas introduced therein, the plasma source comprising:
  - an inductive element operable for coupling electrical energy into the processing space to create an ionized plasma therein;
  - the inductive element winding around a portion of the processing space inside the processing chamber and being non-helical and comprising a plurality of repeated conductor segments arranged in a generally circular pattern around a center axis of the chamber;
  - the inductive element being encased inside a dielectric material to physically separate the element from the processing space while allowing the element to couple electrical energy into the processing space.

* * * * *

UNITED STATES PATENT AND TRADEMARK OFFICE
CERTIFICATE OF CORRECTION

PATENT NO. : 6,494,998 B1  Page 1 of 1
DATED : December 17, 2002
INVENTOR(S) : Brcka, Jozef It is certified that error appears in the above-identified patent and that said Letters Patent is hereby corrected as shown below:

Title page,
Item [56], OTHER PUBLICATIONS, reads "J. Hopwood nd F. Qian," and should read -- J. Hopwood and F. Qian, --.

Column 1,
Line 63, reads "(ICPS)" and should read -- (ICP$_s$) --.

Column 6,
Line 19, reads "Therefore; the" and should read -- Therefore, the --.

Column 16,
Line 22, reads "non-helicai" and should read -- non-helical --.

Signed and Sealed this

Twenty-ninth Day of July, 2003

JAMES E. ROGAN
*Director of the United States Patent and Trademark Office*